US006982205B2

United States Patent

(12) United States Patent
Joo et al.

(10) Patent No.: US 6,982,205 B2
(45) Date of Patent: Jan. 3, 2006

(54) METHOD AND MANUFACTURING A SEMICONDUCTOR DEVICE HAVING A METAL-INSULATOR-METAL CAPACITOR

(75) Inventors: Jae-Hyun Joo, Seoul (KR); Wan-Don Kim, Kyungki-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 344 days.

(21) Appl. No.: 10/055,270

(22) Filed: Jan. 22, 2002

(65) Prior Publication Data

US 2003/0022415 A1 Jan. 30, 2003

(30) Foreign Application Priority Data

Jul. 27, 2001 (KR) .............................. 2001-45487

(51) Int. Cl.
*H01L 21/8242* (2006.01)
*H01L 21/469* (2006.01)
*H01L 21/321* (2006.01)

(52) U.S. Cl. ...................... 438/393; 438/396; 438/785

(58) Field of Classification Search ................ 438/239, 438/240, 250, 253, 255, 256, 393, 396, 398
See application file for complete search history.

(56) References Cited

U.S. PATENT DOCUMENTS 6,204,203 B1 * 3/2001 Narwanka et al. .......... 438/785
6,303,952 B1 * 10/2001 Aoki et al. ................. 257/295
2002/0037630 A1 * 3/2002 Agarwal et al. ............ 438/430

FOREIGN PATENT DOCUMENTS

JP 5102040 4/1993
JP 9102292 4/1997
JP 11087629 3/1999
KR P1999-0062504 7/1999
KR P2001-0026123 4/2001

OTHER PUBLICATIONS

I.K. Yoo et al., Leakage Current Mechanism and Accelerated Unified Test of Lead Ziconate Titanate Thin Film Capacitors. IEEE 1992, pp. 225-228.*
I. Chung et al., Fabrication of Ferroelectric Capacitors Using RuO2/Pt Electrode. IEEE 1996, pp. 93-101.*
G.J. Norga et al. Effect of Crystallisation on Fatigue in Sol-Gel PZT Ferroelectric Capacitors with Reactively Sputtered RuO2 Electrode Layers. IEEE 1998, pp. 3-6.*
English Abstract of P2001-0026123.
English Abstract of P1999-0062504.
English Abstract of JP5102040.
English Language Abstract of Japanese Patent No. JP9102292, filed Apr. 15, 1997.
English Language Absract of Japanese Patent No. JP11087629.

* cited by examiner

*Primary Examiner*—Anh Duy Mai
(74) *Attorney, Agent, or Firm*—Marger Johnson & McCollom, P.C.

(57) ABSTRACT

A fabrication method for forming a semiconductor device having a MIM (Metal-Insulator-Metal) capacitor is provided. A lower electrode is formed on a substrate. The lower electrode is subjected to a pre-annealing. The pre-annealing includes a thermal annealing in a hydrogen atmosphere, a nitrogen atmosphere or a mixed atmosphere of hydrogen and nitrogen. A capacitor dielectric layer is formed on the lower electrode. An upper electrode is formed on the capacitor dielectric layer. According to the present invention, the characteristic of a MIM capacitor can be enhanced by the pre-annealing without any substantial change in the materiality of the lower electrode.

23 Claims, 9 Drawing Sheets

METHOD AND MANUFACTURING A SEMICONDUCTOR DEVICE HAVING A METAL-INSULATOR-METAL CAPACITOR

This application relies for priority upon Korean Patent Application No. 2001-45487, filed on Jul. 27, 2001, the contents of which are herein incorporated by reference in their entirety.

FIELD OF THE INVENTION

The present invention relates to methods for manufacturing semiconductor devices and, more particularly, to methods for forming MIM (Metal-Insulator-Metal) capacitors of DRAM (Dynamic Random Access Memory) devices.

BACKGROUND OF THE INVENTION

In the continuing trend to higher memory capacity, the size of a unit cell has been continuously decreased in order to increase the packing density of memory devices. The reduced unit cell size results in a decreased capacitor area of a DRAM unit cell, which comprises a capacitor for use as an information storage unit and a switching transistor connected to the capacitor. The decreased capacitor area means decreased cell capacitance, and it results in lowered read-out capability of the memory cell and increased soft error.

As one approach to solve the above-mentioned problem, capacitors having three-dimensional structures have been proposed in an attempt to increase an effective capacitor area in a unit cell. These types of capacitors usually have a lower electrode in the shape of a fin, a box, or a cylinder. However, the manufacturing processes for forming the three-dimensional capacitors may be so complicated as to generate defects.

Another approach is increasing the capacitance per unit capacitance area. Examples of this approach are a MIM (Metal-Insulator-Metal) capacitor and a MIS (Metal-Insulator-silicon) capacitor. The structure of the MIS capacitor includes a lower electrode formed of a metal, upper electrode formed of silicon and a capacitor dielectric layer interposed between the lower electrode and the upper electrode. The MIS capacitor has usually been used in DRAM devices having a memory capacity under 16-mega bits. The structure of the MIM capacitor includes a lower electrode formed of a metal, an upper electrode formed of the same metal or another metal, and a capacitor dielectric layer interposed between the lower electrode and the upper electrode. The MIM capacitor generally has better capacitance and leakage current characteristics compared to the MIS capacitor. Therefore, the MIM capacitor has been used as a capacitor in many DRAM devices having a memory capacity of 16-mega bits or more.

In the MIM capacitor, the lower electrode is usually made of a noble metal or its oxide. The noble metal includes platinum, ruthenium, iridium, rhodium and osmium. Each of the materials of the lower electrode is required to have a low work function value and not be reactive to the capacitor dielectric layer. Ruthenium is most widely used in the industry as a material of the lower electrode. This is because ruthenium can easily etched, especially in a plasma environment having oxygen, and its oxide, i.e., ruthenium oxide, is a good electrically conductive material.

Generally, a PVD (Physical Vapor Deposition) method and a CVD (Chemical Vapor Deposition) method can be used to form lower and upper electrodes of the MIM capacitors, but the CVD method is more widely used because a layer formed thereby is more conformable to a step difference of an underlaid structure. The conventional CVD method for forming a noble metal layer includes producing a metal organic source and oxygen into a processing chamber. The oxygen continuously decomposes the metal organic source to form the noble metal layer on a heated substrate.

FIG. 1 is a graph showing leakage current characteristics of MIM capacitors formed by the conventional CVD and PVD methods. The horizontal axis represents applied voltage into two electrodes of the MIM capacitors and the vertical axis represents corresponding leakage current. Ruthenium is used as material for lower and upper electrodes of the MIM capacitors, and tantalum oxide is used as a material for the capacitor dielectric layers. In the conventional method for forming the MIM capacitor, a capacitor dielectric layer is first formed on the lower electrode. The capacitor dielectric layer is then subjected to a crystallization annealing which is performed at 700° C. for 30 minutes in a nitrogen atmosphere in order to increase the capacitance of the capacitor. The upper electrode is formed on the capacitor dielectric layer. Subsequently, the upper electrode is subjected to a curing, which is performed at 400° C. for 30 minutes in an oxygen atmosphere. The reference marks '■' represent data of a capacitor having a lower electrode made by the CVD method, and the reference marks '●' represent data of a capacitor having a lower electrode made by the PVD method. As shown in the graph, the capacitor made by the CVD method has a large leakage current than the capacitor made by the PVD method.

According to the analysis of present inventors, the large leakage current problem in the capacitor having the lower electrode made by the CVD method is due to impurities, e.g., carbons. The impurities are produced in the lower electrode when the metal organic source gas is not completely decomposed during the CVD process for forming the lower electrode. The impurities are thought to suppress the crystallization of the capacitor dielectric layer. Moreover, the impurities may induce defects in the capacitor dielectric layer, even though the impurities are too small amount to be detected by SIMS (Secondary Ion Mass Spectrometry) analysis. The defects act as sources of the leakage current.

On the other hand, the impurities react with the capacitor dielectric layer and form an unfavorable layer having a low dielectric constant between the capacitor dielectric layer and the lower electrode during the crystallization annealing. Therefore, a Tox (effective silicon oxide thickness) value may also be increased. The Tox value represents an effective thickness of a capacitor dielectric layer of a capacitor on the assumption that the capacitor dielectric layer was made of silicon oxide. Therefore, the increased Tox value means that capacitance per unit capacitor area is decreased.

Accordingly, the need remains for method for forming capacitors so that a high capacitance per unit area is maintained.

SUMMARY OF THE INVENTION

It is an object of the present invention to provide a method for forming a semiconductor device having a capacitor, wherein the impurities can be removed from the surface of the lower electrode by a pre-annealing. Therefore, the leakage current can be substantially suppressed and the capacitance per unit capacitor area can be substantially prevented from being decreased.

It is another object of the present invention to provide a method for forming a capacitor having improved electrical characteristics without any substantial change in the materiality.

It is another object of the present invention to provide a method for forming a capacitor having improved electrical characteristics, wherein a crystallization annealing can be performed at significantly lower temperatures.

According to one aspect of the present invention, a method of fabricating a semiconductor device is provided. The method comprises forming a lower electrode on a substrate. The lower electrode is preferably formed of a metal made by a CVD method. A metal organic material is used as a source of the CVD method. The lower electrode is subjected to a pre-annealing step. The pre-annealing is a thermal annealing under a selected atmosphere at a temperature range of between approximately 350~750° C. The selected atmosphere comprises hydrogen, nitrogen or a mixed hydrogen and nitrogen gas. The pre-annealing does not substantially change the materiality of the lower electrode. A capacitor dielectric layer is formed of a crystalline material on the lower electrode. The capacitor dielectric layer may be subjected to a crystallization annealing. A processing temperature of the pre-annealing step is preferably higher than that of the crystallization annealing step. An upper electrode is then formed on the capacitor dielectric layer.

According to another aspect of the present invention, a method of fabricating a semiconductor device is provided. The method comprises forming a lower electrode on a substrate. The lower electrode is subjected to a pre-annealing step. The pre-annealing step is a treatment exposing the lower electrode to a plasma atmosphere comprising hydrogen. The pre-annealing step does not substantially change the materiality of the lower electrode. A capacitor dielectric layer is formed of a crystalline material on the lower electrode. The capacitor dielectric layer may be subjected to a crystallization annealing. A processing temperature of the pre-annealing step is preferably higher than that of the crystallization annealing step. An upper electrode is then formed on the capacitor dielectric layer.

According to another aspect of the present invention, a method of fabricating a semiconductor device is provided. The method comprises forming a metal lower electrode on a substrate. The metal lower electrode is formed by a CVD method. The metal lower electrode is subjected to a pre-annealing step. The pre-annealing step is one selected from the group consisting of a thermal annealing under a selected atmosphere and a treatment exposing the metal lower electrode under a plasma atmosphere. The selected atmosphere may comprise hydrogen and the thermal annealing may be performed at about 450° C. The selected atmosphere may comprise nitrogen and the thermal annealing may be performed at about 700° C. The selected atmosphere preferably may be a mixed atmosphere including about 90% nitrogen and about 10% hydrogen by volume, and the thermal annealing may be performed and at about 450° C. A capacitor dielectric layer is formed on the metal lower electrode. The capacitor dielectric layer is formed of a crystalline material. An upper electrode is formed on the capacitor dielectric layer. The pre-annealing step does not substantially change the materiality of the metal lower electrode. The capacitor dielectric layer may be subjected to a crystallization annealing step. A processing temperature of thermal annealing is higher than that of the crystallization annealing step, where the processing temperature of crystallization annealing is preferably about 650° C.

BRIEF DESCRIPTION OF THE DRAWINGS

Other features of the present invention will be more readily understood from the following detail description of specific embodiment thereof when read in conjunction with the accompanying drawings, in which.

DESCRIPTION OF THE PREFERRED EMBODIMENT

Preferred embodiments of the present invention will be described hereinafter with reference to the accompanying drawings, even though the scope of the present invention is not limited to the embodiments.

Figure 1:
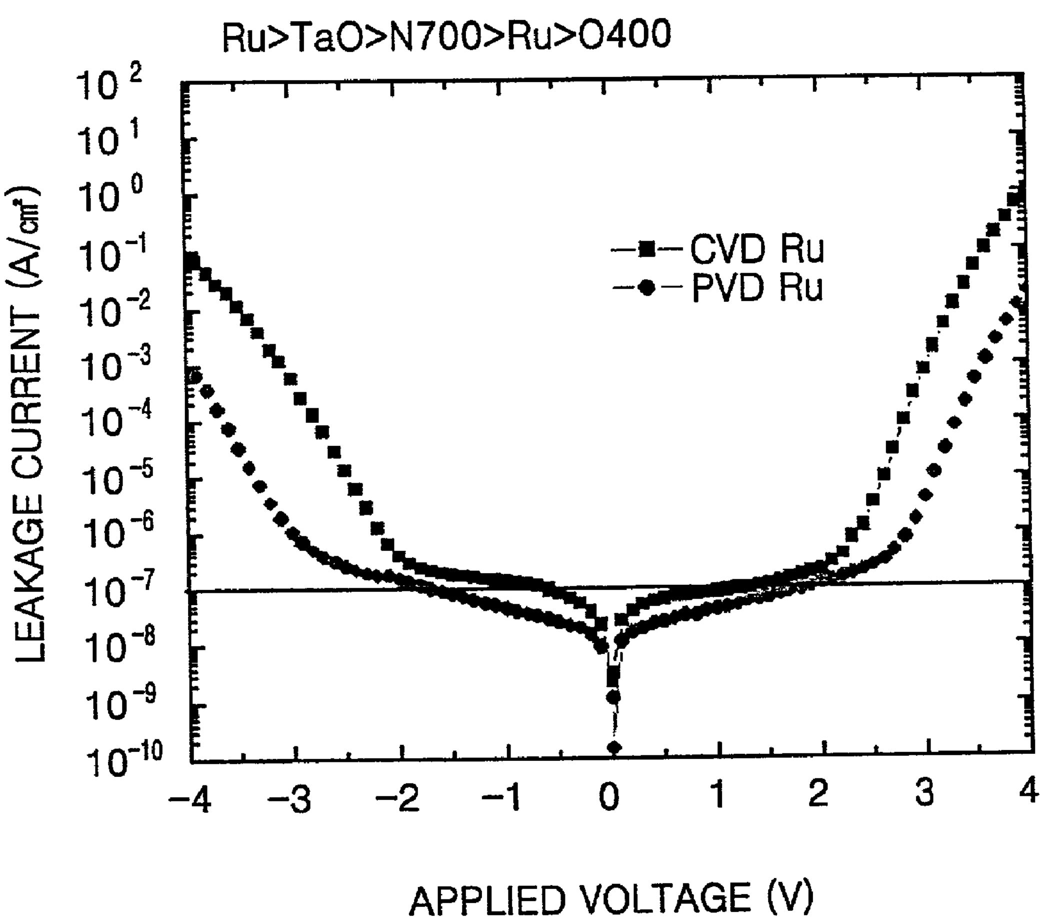
FIG. 1 is a graph showing a leakage current characteristic of a MIM capacitor formed by conventional methods.
Figure 2A:
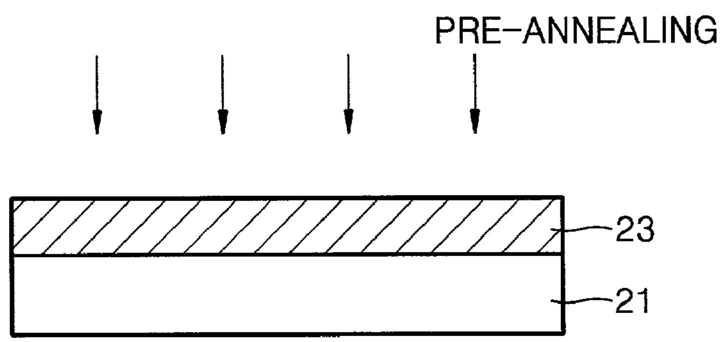
FIGS. 2A through 2C are cross-sectional views illustrating successive process steps for forming a capacitor according to a preferred embodiment of the present invention.
Figure 2B:
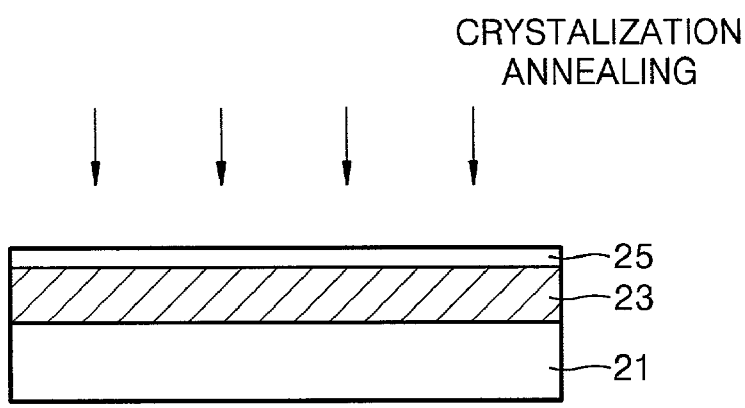
Figure 2C:
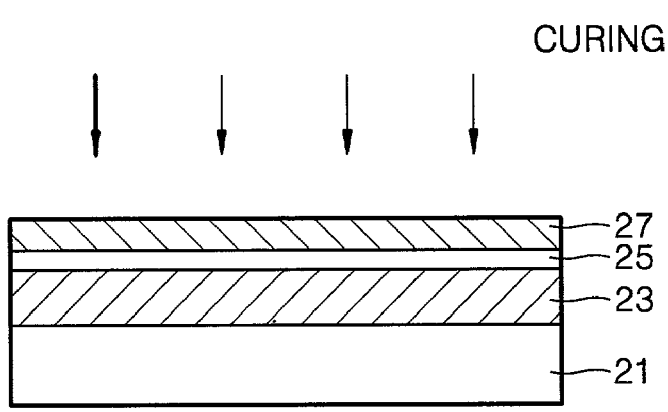

FIGS. 2A through 2C are cross-sectional views illustrating successive process steps for forming a MIM capacitor according to a present invention.

Referring to FIG. 2A, a lower electrode 23 of the MIM capacitor is formed on a substrate 21 by using a metal organic compound as a source of a CVD process. The lower electrode 23 is made of a material selected from the group consisting of ruthenium, ruthenium oxide, iridium, iridium oxide, platinum and platinum oxide. In case of ruthenium or ruthenium oxide as a material of the lower electrode 23, the metal organic compound source is preferably $Ru(C_3H_5C_5H_4)_2$(=Ru(EtCp)$_2$), $Ru(CH_3C_5H_4)_2$(=Ru(MeCp)$_2$), $Ru(C_5H_5)_2$(=Ru(Cp$_2$)), $Ru(C_9H_{15}O_2)_3$(=Ru(dmhpd)$_3$), $Ru(C_{10}H_{17}O_2)_3$(=Ru(tmphd)$_3$) or $Ru(C_{11}H_{19}O_2)_3$(=Ru(dpm)$_3$). In case of platinum or platinum oxide as a material of the lower electrode 23, the metal organic compound source is preferably $(CH_3)_3Pt(C_5H_4C_5H_5)$(=Me$_3$Pt(EtCp)), $(CH_3)_3Pt(C_5H_5)$(=Me$_3$PtCp), $(CH_3)_3Pt(CH_5C_5H_4)$(=Me$_3$Pt(MeCp)), $Pt(C_5H_7O_2)_2(C_3H_5)Pt(C_5H_5$(=Pt(acac)$_2$) or $Pt(C_5HF_6O_2)_2$(=Pt(HFA)$_2$).

Subsequently, the lower electrode 23 is subjected to a pre-annealing. The pre-annealing includes a thermal annealing under a selected atmosphere and a treatment exposing the lower electrode 23 to a plasma atmosphere. The plasma is preferably a hydrogen plasma atmosphere. The selected atmosphere of the thermal annealing is preferably a hydrogen atmosphere, a nitrogen atmosphere or a mixed atmosphere. The mixed atmosphere preferably includes nitrogen and hydrogen. The pre-annealing is performed at a temperature range of between about 350~750° C., especially when lower electrode is thermally annealed under a hydrogen atmosphere or the mixed atmosphere. With the hydrogen atmosphere, the thermal annealing is performed preferably at about 450° C. With the nitrogen atmosphere, the thermal annealing is performed preferably at about 700° C. With the mixed atmosphere, the thermal annealing is performed preferably at about 450° C. for 30 minutes under a mixed atmosphere including about 90% nitrogen and about 10% hydrogen by volume. The pre-annealing step is preferably performed at a higher temperature than a temperature of the crystallization annealing step, which is to be performed in a subsequent process step. This is helpful in minimizing the crystalline growth of the lower electrode 23 during the crystallization annealing.

Referring to FIG. 2B, a capacitor dielectric layer 25 is formed on the lower electrode 23 by the CVD method. The capacitor dielectric layer 25 is made of a material selected from the group consisting of $Ta_2O_5$, $SrTiO_3$, $(Ba,Sr)TiO_3$, $PbTiO_3$, $Pb(Zr,Ti)O_3$, $SrBi_2Ta_2O_5$, $(Pb,La)(Zr,Ti)O_3$, $Bi_4Ti_3O_{12}$ and $BaTiO_3$. The capacitor dielectric layer 25 is preferably made of crystalline material. In order to enhance a capacitance characteristic, the capacitor dielectric layer 25 is subjected to crystallization annealing under nitrogen atmosphere. The crystallization annealing is performed preferably at about 650° C., which is lower than the conventional crystallization annealing temperature, where the crystallization annealing is performed at relatively high temperatures, i.e., about 700° C., to significantly enhance the capacitance characteristic of a MIM capacitor. This is distinguished from the present invention, where the crystallization annealing can be performed at relatively low temperatures, i.e., about 650° C. In general, the low temperature of the crystallization annealing is helpful to enhance the electrical characteristics of devices that are formed under the capacitor.

Referring to FIG. 2C, an upper electrode 27 is formed on the capacitor dielectric layer 25. The upper electrode 27 is made of a noble metal or its oxide. The noble metal includes platinum, ruthenium, iridium, rhodium and osmium. Subsequently, the upper electrode 27 is subjected to a curing in order to suppress leakage current of the capacitor. The curing is performed at about 400° C. in an oxygen atmosphere. In a modified embodiment of the present invention, a crystallization annealing step may be performed after forming the upper electrode 27.

The electrical characteristics of the MIM capacitors of the present invention will be described in detail. Each of the MIM capacitors includes a lower electrode of ruthenium, a capacitor dielectric layer of tantalum oxide, and an upper electrode of ruthenium.

In FIGS. 3A through 4B, the graphs show characteristics of two groups of capacitors. One group is formed by the conventional method. That is, the pre-annealing is not performed, but the crystallization annealing in a nitrogen atmosphere and the curing in an oxygen atmosphere are performed. The other group is made by the method of the present invention. That is, the crystallization annealing takes place in a nitrogen atmosphere, the curing is performed in an oxygen atmosphere, and the additional thermal annealing is performed in a hydrogen atmosphere.

Figure 3A:
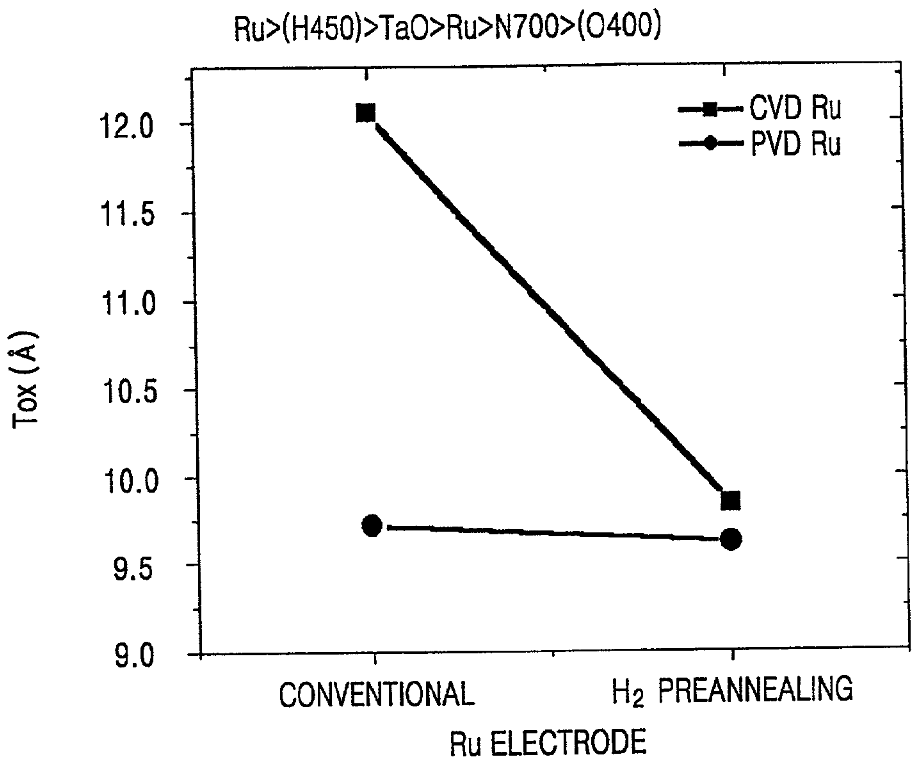
FIG. 3A is a graph showing a change in Tox values by pre-annealing.

FIG. 3A is a graph showing change in Tox values by pre-annealing. The reference marks '■' represent data of capacitors having lower electrodes that are made by the CVD method and the reference marks '●' represent data of capacitors having lower electrodes that are made by the PVD method. On the horizontal axis of the graph in FIG. 3A, "CONVENTIONAL" means that the pre-annealing step is not performed but the crystallization annealing step in a nitrogen atmosphere and the curing in an oxygen atmosphere are performed, and "$H_2$ PREANNEALING" means that the thermal annealing in a hydrogen atmosphere, the crystallization annealing in a nitrogen atmosphere, and the curing in a oxygen atmosphere are performed. As shown in the graph, the Tox value is dramatically decreased by the hydrogen thermal annealing in capacitors formed by using the CVD method relatively to capacitors formed by using the PVD method. The decrement rate of the Tox value of the capacitors formed by using the CVD method is approximately 30%.

Figure 3B:
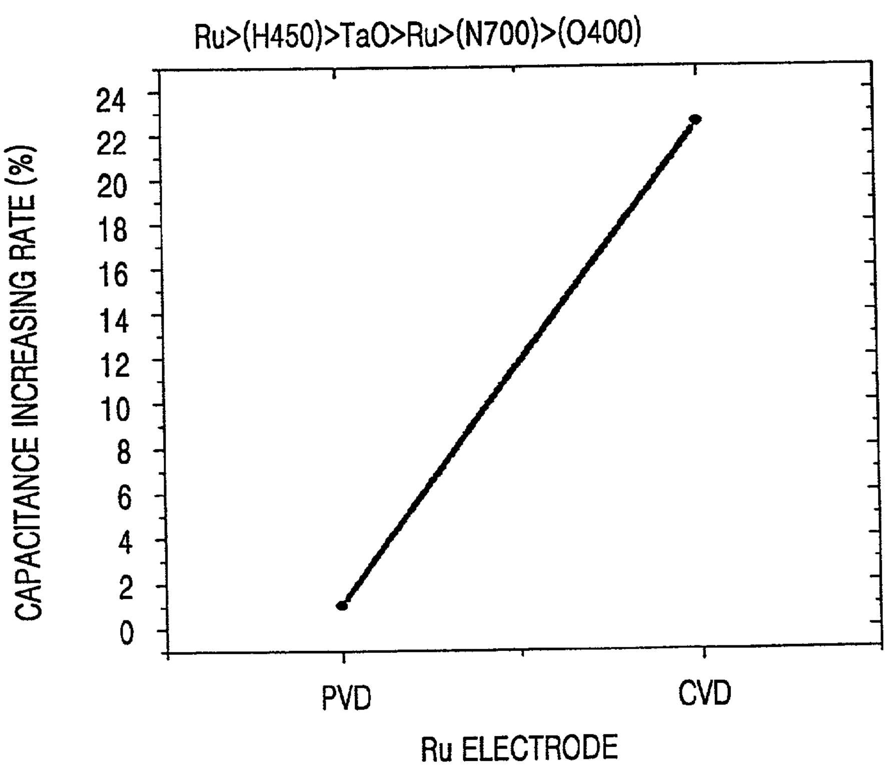
FIG. 3B is a graph showing capacitance increment rates by the pre-annealing the lower electrode of a capacitor.

FIG. 3B is a graph showing capacitance increment rates by the thermal annealing in a hydrogen atmosphere. On the horizontal axis of the graph in FIG. 3B, "PVD" means that a lower electrode is made by the PVD method, and "CVD" means that a lower electrode is made by the CVD method. As shown in the graph, capacitance is increased approximately 24% in a capacitor having a lower electrode made by the CVD method, while capacitance is increased slightly in a capacitor having a lower electrode made by the PVD method.

Figure 4A:
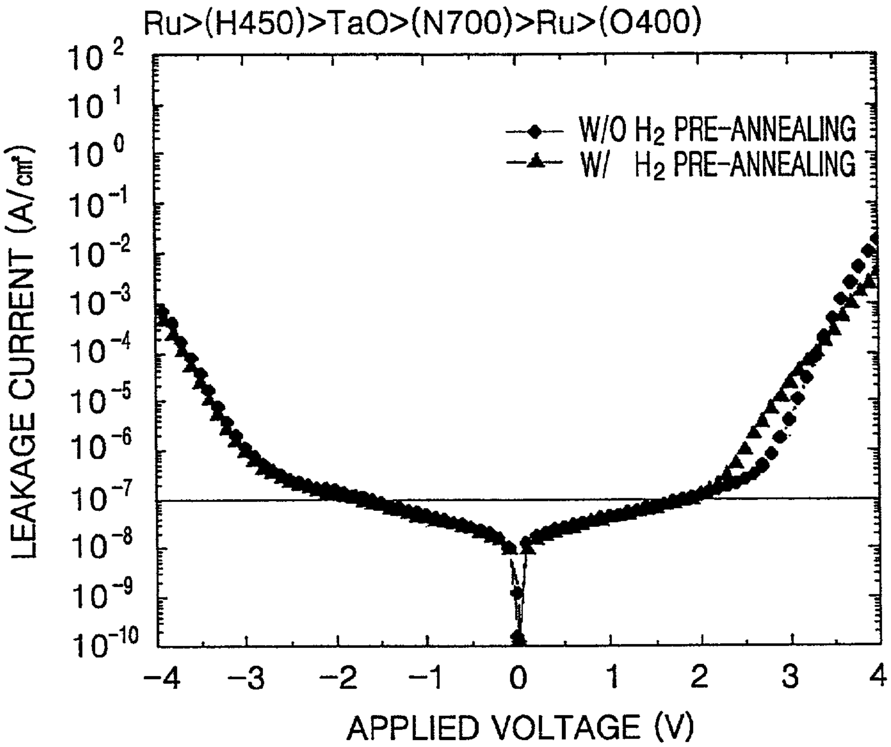
FIG. 4A is a graph showing a leakage current characteristic of MIM capacitors, wherein lower electrodes are formed by a PVD method.
Figure 4B:
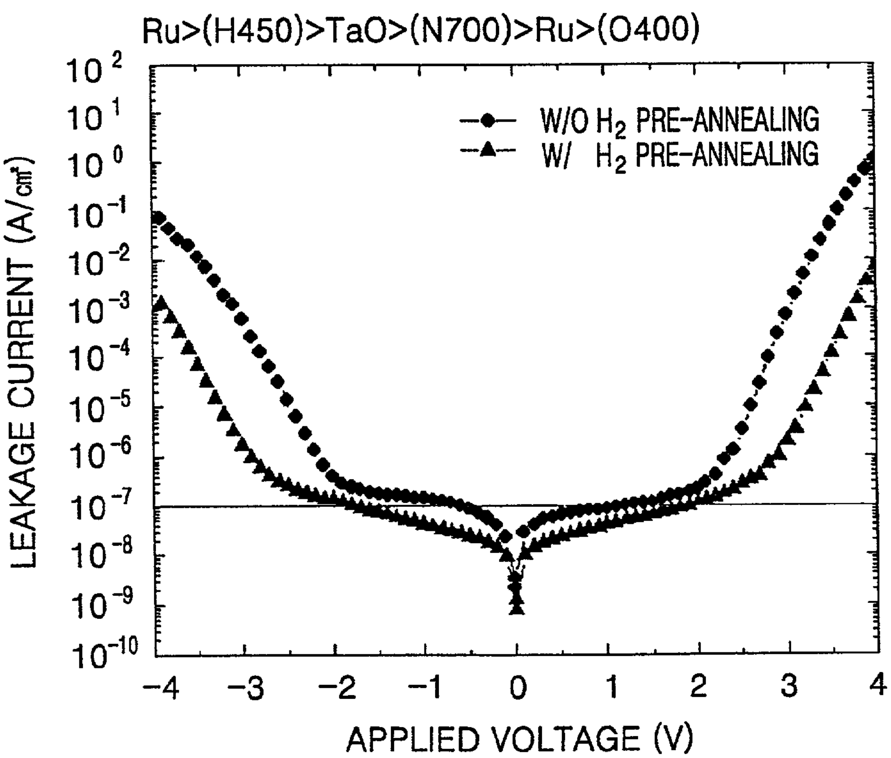
FIG. 4B is a graph showing a leakage current characteristic of MIM capacitors, wherein lower electrodes are formed by a CVD method.

FIGS. 4A and 4B are graphs showing leakage current characteristics of MIM capacitors. The reference marks '▲' represent data of capacitors, wherein the thermal annealing under hydrogen atmosphere is performed. The reference marks '●' represent data for capacitors, where the thermal annealing in a hydrogen atmosphere is not performed. In FIG. 4A, lower electrodes are formed by the PVD method. In FIG. 4B, lower electrodes are formed by the CVD method. The horizontal axes represent applied voltage into two electrodes of each MIM capacitor and the vertical axes represent corresponding leakage current. As shown in the graph, the capacitors having by the CVD method have significantly decreased leakage current caused by the thermal annealing in a hydrogen atmosphere. For capacitors formed by the PVD method, leakage current is not significantly decreased.

Figure 5A:
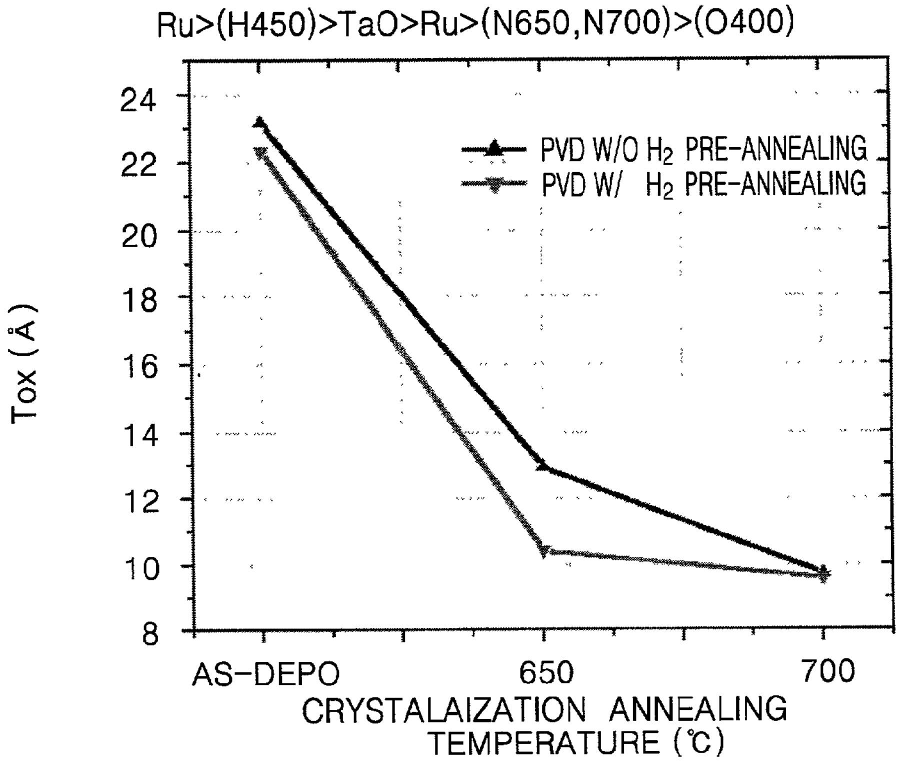
FIG. 5A is a graph showing Tox values with the process condition of the crystallization annealing as a variable, wherein a lower electrode is formed by the PVD method.
Figure 5B:
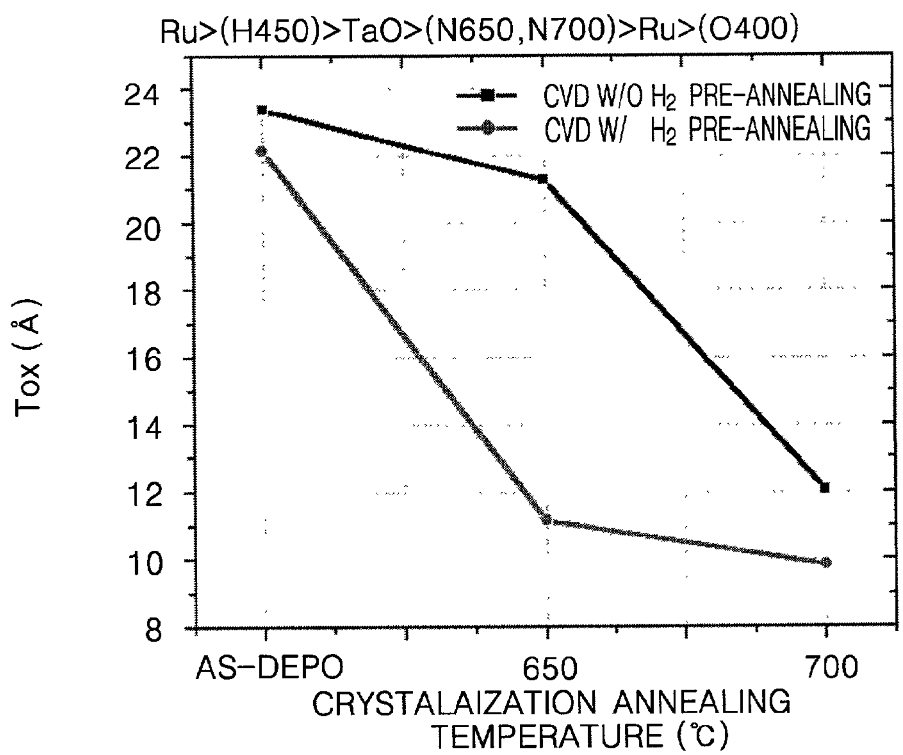
FIG. 5B is a graph showing Tox values with the process condition of the crystallization annealing as a variable, wherein a lower electrode is formed by the CVD method.

FIGS. 5A and 5B are graphs showing Tox values of capacitors formed by crystallization annealing under various temperature conditions. The horizontal axes represent temperature of crystallization annealing and the vertical axes represent Tox value. On the horizontal axes of the graphs, "as-depo" means that the crystallization annealing is not performed. In FIG. 5A, a lower electrode is formed by the PVD method. In FIG. 5B, a lower electrode is formed by the CVD method. In FIG. 5A, the reference marks '▼' represent data of a capacitor formed using thermal annealing in a hydrogen atmosphere at 450° C. In FIG. 5A, the reference marks '▲' represent data of a capacitor not formed by thermal annealing in a hydrogen atmosphere. In FIG. 5B, the reference marks '●' represent data of a capacitor formed by thermal annealing in a hydrogen atmosphere at 450° C. In FIG. 5B, the reference marks '■' represent data of a capacitor not formed by thermal annealing under hydrogen atmosphere.

As shown in FIG. 5B, the Tox value for a lower electrode made by the CVD method can be significantly reduced by thermal annealing in a hydrogen atmosphere, even though the crystallization annealing is performed at relatively low temperatures, i.e., 650° C. This is in contrast to conventional methods where the crystallization annealing is performed at relatively high temperature, i.e., about 700° C., thereby significantly reducing the Tox value for capacitors having lower electrodes made by the CVD method. In present invention, however, the crystallization annealing can be performed at relatively low temperatures, i.e., about 650° C. In general, the low temperature of the crystallization annealing is helpful to enhance the electrical characteristics of devices that are formed under the capacitor.

In FIGS. 5A and 5B, Tox values are more effectively decreased by thermally annealing the CVD-produced lower electrodes in a hydrogen atmosphere than the PVD-produced lower electrodes. The lowered Tox value of capacitors having lower electrodes made by the CVD method is approximately the same value as those of capacitors having lower electrodes made by the PVD method.

Figure 6A:
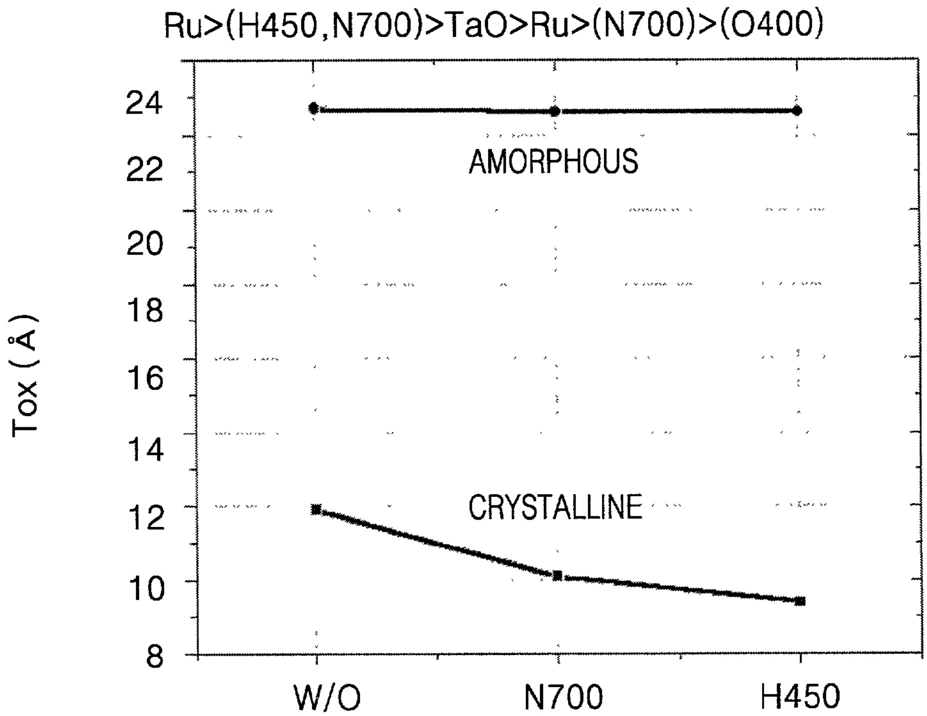
FIG. 6A is a graph showing Tox values with the process condition of the pre-annealing as a variable in connection with materiality of a capacitor dielectric layer, wherein a lower electrode is formed by the CVD method.

FIG. 6A is a graph showing Tox values of capacitors formed by using or not using a pre-annealing step in connection with the materiality of a capacitor dielectric layer, wherein a lower electrode is formed by the CVD method. The horizontal axis represents whether pre-annealing has occurred and the vertical axis represents the Tox value. On the horizontal axis of the graph in FIG. 6A, "W/O" means that a lower electrode is not subjected to the pre-annealing, "N700" means that a lower electrode is subjected to the thermal annealing in a nitrogen atmosphere at 700° C., and "H450" means that a lower electrode is subjected to the thermal annealing in a hydrogen atmosphere at 450° C. The reference marks '■' represent data of capacitors, with capacitor dielectric layers made of crystalline tantalum oxide. The reference marks '●' represent data of capacitors, with capacitor dielectric layers made of amorphous tantalum oxide. As shown in the graph, there is no significant change in the Tox values of amorphous tantalum oxide as a capacitor dielectric layer. The Tox values are approximately 23 Å. However, in case of amorphous tantalum oxide, the Tox value is significantly decreased by thermal annealing in a hydrogen atmosphere and a nitrogen atmosphere. The Tox value is approximately 12 Å for "W/O", but approximately 9 Å and 10 Å for "H450" and "N700", respectively. The thermal annealing in a hydrogen atmosphere results in a lower Tox value than thermal annealing in a nitrogen atmosphere.

Figure 6B:
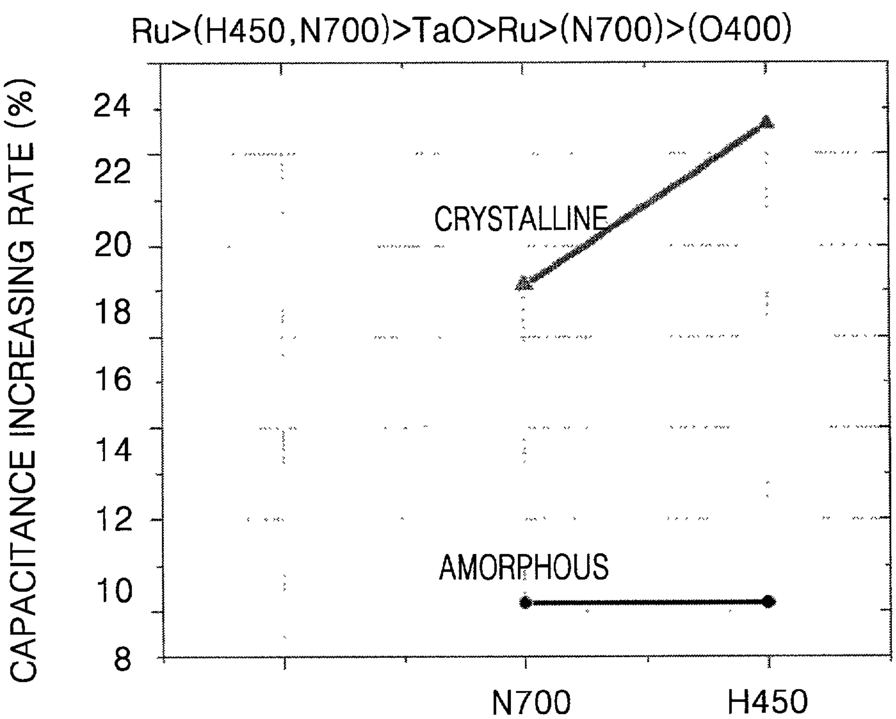
FIG. 6B is a graph showing capacitance increment rates with the process condition of the pre-annealing as a variable in connection with materiality of a capacitor dielectric layer, wherein a lower electrode is formed by the CVD method.

FIG. 6B is a graph showing capacitance increment rates with or without pre-annealing in connection with the materiality of a capacitor dielectric layer, wherein a lower electrode is formed by the CVD method. The horizontal axis represents whether pre-annealing has occurred and the vertical axis represents the capacitance increment rate. On the horizontal axis of the graph in FIG. 6B, the meanings of "N700" and "H450" are same as those in FIG. 6A. The reference marks '▲' represent data of capacitors having capacitor dielectric layers made of crystalline tantalum oxide. The reference marks '●' represent data of capacitors having capacitor dielectric layers made of amorphous tantalum oxide. As shown in the graph, in case of amorphous tantalum oxide, the pre-annealing has no effect on the capacitance. However, in case of amorphous tantalum oxide, the pre-annealing significantly increases the capacitance. The thermal annealing in a hydrogen atmosphere results in a higher capacitance increment rate than the thermal annealing in a nitrogen atmosphere.

Figure 7A:
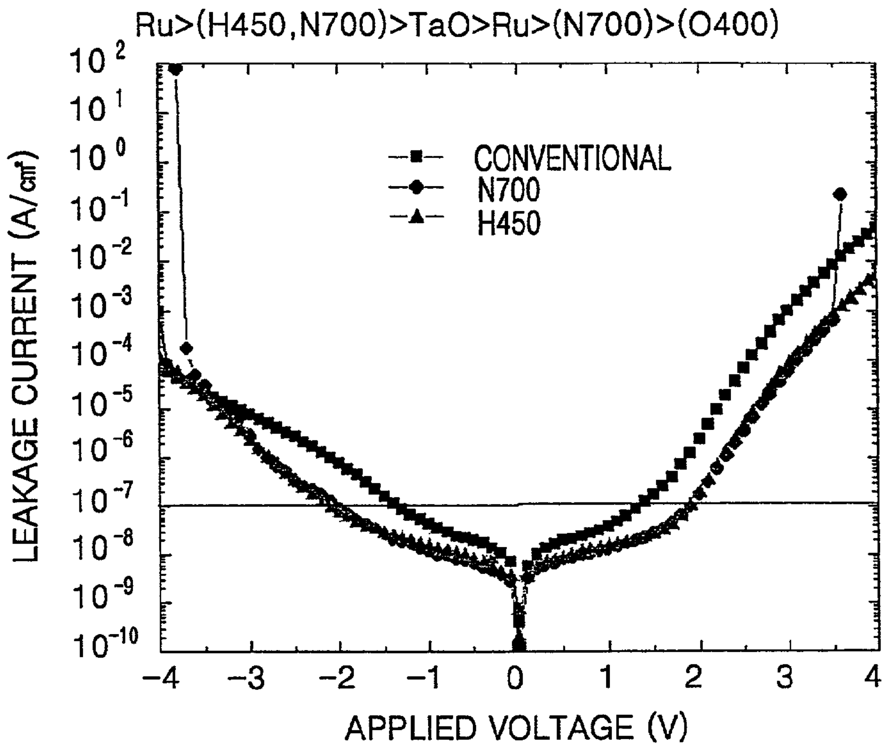
FIG. 7A is a graph showing a leakage current characteristic of a MIM capacitors having amorphous capacitor dielectric layers, wherein lower electrodes are formed by the CVD method.
Figure 7B:
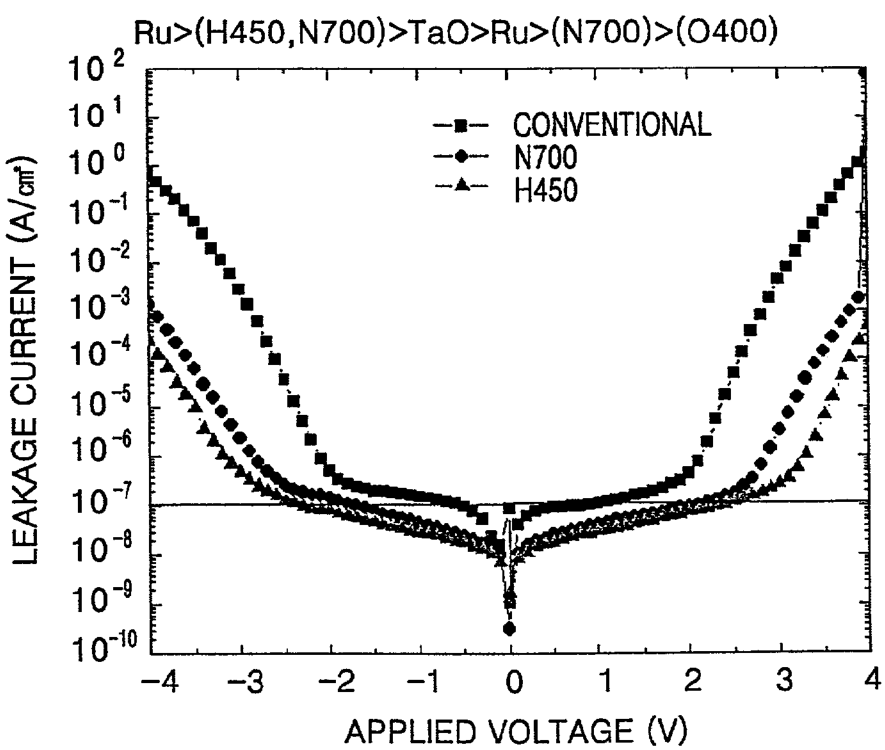
FIG. 7B is a graph showing a leakage current characteristic of MIM capacitor having crystalline capacitor dielectric layers, wherein the lower electrode is formed by the CVD method.

FIGS. 7A and 7B are graphs showing leakage current characteristics of MIM capacitors. In FIG. 7A, the capacitors have amorphous capacitor dielectric layers. In FIG. 7B, the capacitors have crystalline capacitor dielectric layers. In both FIGS. 7A and 7B, lower electrodes are formed by the CVD method. The horizontal axes represent the applied voltages into the two electrodes of each MIM capacitors and the vertical axes represent the corresponding leakage currents. The reference marks '■' represent data of capacitors having a lower electrode not subjected to pre-annealing. The reference marks '●' represent data of capacitors having a lower electrode subjected to thermal annealing in a nitrogen atmosphere at 700° C. The reference marks '▲' represent data of capacitors having a lower electrode subjected to thermal annealing in a hydrogen atmosphere at 450° C. As shown in the graphs, leakage current for amorphous tantalum oxide is slightly decreased by pre-annealing. However, in case of crystalline tantalum oxide, the pre-annealing significantly decreases leakage current. Thermal annealing in a hydrogen atmosphere makes a better result than thermal annealing in a nitrogen atmosphere.

As described above in connection with FIGS. 6A, 6B, 7A and 7B, pre-annealing better improves the electrical characteristics of capacitors having crystalline capacitor dielectric layers than those of capacitors having amorphous capacitor dielectric layers.

Figure 8A:
FIG. 8A is a SEM (Scanning Electron Microscope) photograph showing a surface morphology of a ruthenium layer without the pre-annealing step, wherein the ruthenium layer is formed by the CVD method.
Figure 8B:
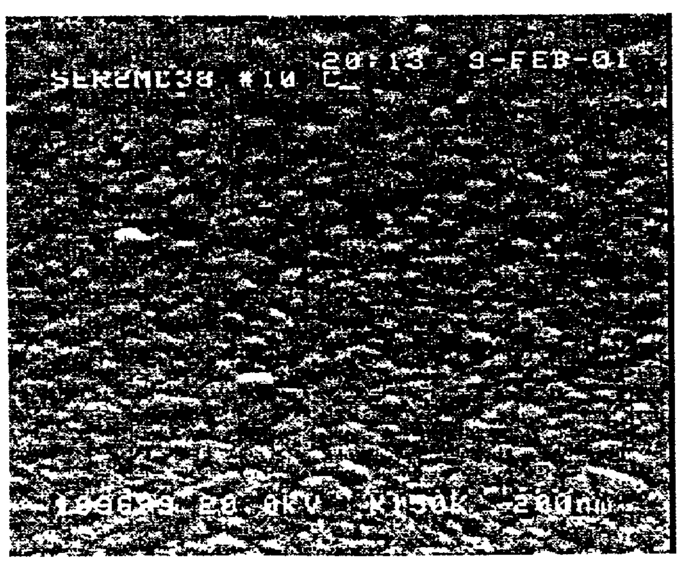
FIG. 8B is a graph showing a surface morphology of a ruthenium layer with the pre-annealing step, wherein the ruthenium layer is formed by the CVD method.

FIG. 8A is a SEM (Scanning Electron Microscope) photograph showing a surface morphology of a ruthenium layer before the thermal annealing step in a hydrogen atmosphere is performed, and FIG. 8B is a graph showing the same after the thermal annealing in a hydrogen atmosphere is performed. The ruthenium layer is formed by the CVD method. As shown in the graphs, there is no significant change in the morphology of the ruthenium layer except that grain size is slightly increased after the thermal annealing.

Figure 9:
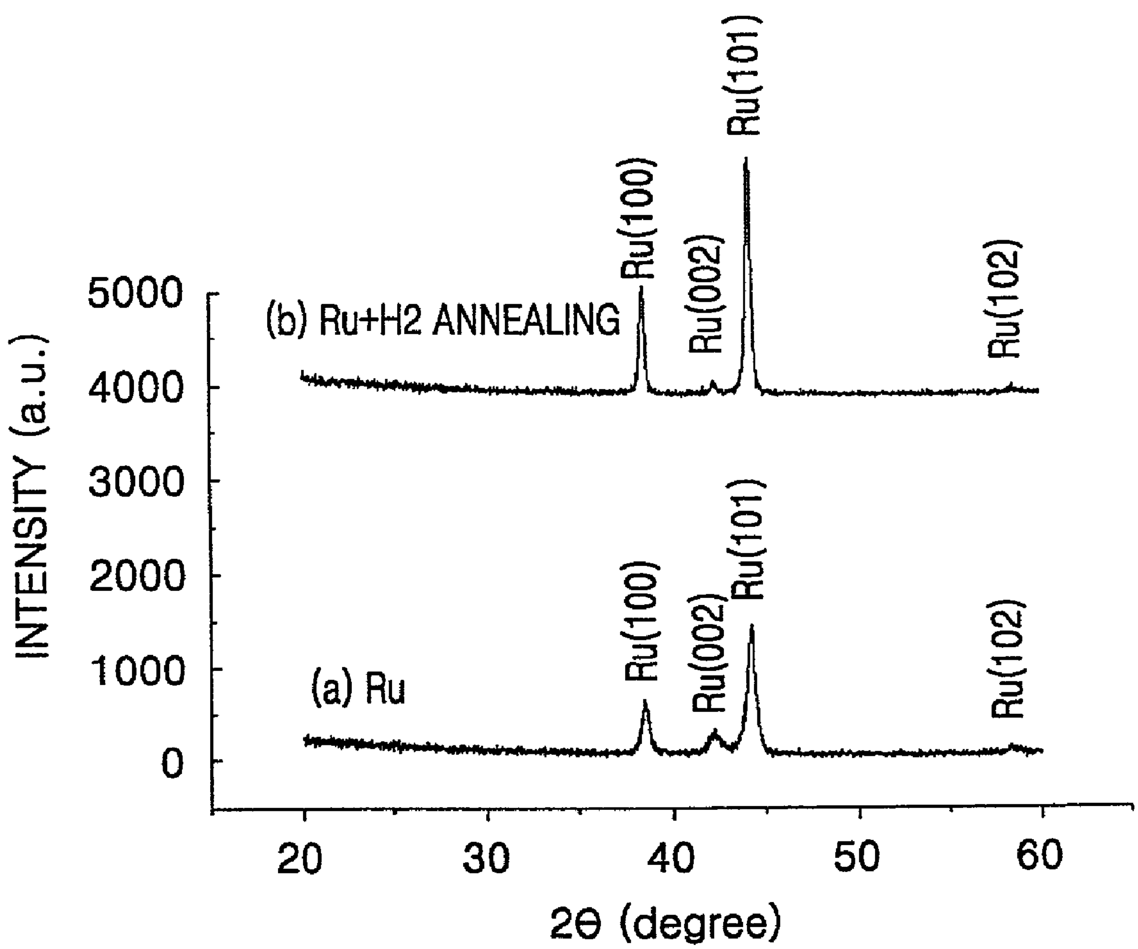
FIG. 9 is a graph showing the crystallinity of ruthenium layers, wherein the ruthenium layers are formed by the CVD method.

FIG. 9 is a graph showing crystallinity of ruthenium layers, wherein the ruthenium layers are formed by the CVD method. The graphs are result from XRD (X-ray Radiation Diffraction) analysis of the ruthenium layers. The upper profile of the XRD analysis shows crystallinity of a ruthenium layer on which the thermal annealing in a hydrogen atmosphere is performed. The lower profile of the XRD analysis shows crystallinity of a ruthenium layer on which the thermal annealing in a hydrogen atmosphere is not performed. As shown in the graph, there is no difference between the profiles except that (100) and (101) peaks are slightly increased after the thermal annealing is performed.

As shown in the FIGS. 8A, 8B and 9, pre-annealing does not make any substantial change in the materiality of the ruthenium layer. Therefore, the pre-annealing enhances the characteristic of the surface of the lower electrode without any substantial change in the materiality of the lower electrode.

As described above, according to the present invention, the impurities, which are induced by the incomplete decomposition of the metal organic compound source, can be removed from the surface of the lower electrode by the pre-annealing. Therefore, the leakage current can be substantially suppressed and the capacitance per a unit capacitor area can be substantially prevented from being decreased. The result is better in case of a crystalline capacitor dielectric layer than in case of an amorphous capacitor dielectric layer.

According to the present invention, the characteristic of a MIM capacitor can be enhanced by the pre-annealing without any substantial change in the materiality of the lower electrode. The words 'without any substantial change in the materiality' mean that the material of the lower electrode is not changed into another material in substance. For example, if the material of lower electrode is changed from a metal into a metal oxide during the process for forming a capacitor, there is substantial change in the materiality.

In the drawings and specification, there have been disclosed typical preferred embodiments of the invention. Although specific terms are employed, they are used in a generic and descriptive sense only and not for purpose of limitation. For example, the term 'pre-annealing' is not limited to the thermal annealing under a selected atmosphere and the treatment under a plasma atmosphere. It will be understood by those skilled in the art that various changes in the embodiments of pre-annealing may be made without departing from the spirit and scope of the invention.

What is claimed is:

1. A method of fabricating a semiconductor device, comprising the steps of:

forming a lower electrode on a substrate using a source having carbon;

subjecting the lower electrode to a pre-annealing for removing carbon remaining in the lower electrode, wherein the pre-annealing is a thermal annealing under a selected atmosphere;

forming a capacitor dielectric layer on the pre-annealed lower electrode, wherein the capacitor dielectric layer includes tantalum oxide ($Ta_2O_5$);

subjecting the tantalum oxide ($Ta_2O_5$) capacitor dielectric layer to a temperature that is lower than a conventional crystallizing temperature of tantalum oxide dielectric material until crystallization of the tantalum oxide capacitor dielectric occurs; and forming an upper electrode on the capacitor dielectric layer, wherein the lower electrode is formed of metal.

2. The method of claim 1, wherein the lower electrode is formed of a material selected from the group consisting of ruthenium and platinum.

3. The method of claim 1, wherein a metal organic material is used as a source of the CVD method.

4. The method of claim 3, wherein the pre-annealing does not substantially change the materiality of the lower electrode.

5. The method of claim 4, wherein the pre-annealing is performed at a range of between 350~750° C.

6. The method of claim 3, wherein the selected atmosphere comprises a hydrogen gas.

7. The method of claim 3, wherein the selected atmosphere comprises a nitrogen gas.

8. The method of claim 3, wherein the selected atmosphere is a mixed atmosphere.

9. The method of claim 8, wherein the mixed atmosphere comprise a hydrogen and a nitrogen gas.

10. A method of fabricating a semiconductor device, comprising the steps of:

forming a lower electrode on a substrate by CVD method using a source having carbon;

subjecting the lower electrode to a pre-annealing for removing carbon remaining in the lower electrode, wherein the pre-annealing is a treatment exposing the lower electrode under a plasma atmosphere;

forming a tantalum oxide ($Ta_2O_5$) capacitor dielectric layer on the pre-annealed lower electrode subjecting the tantalum oxide ($Ta_2O_5$) capacitor dielectric layer to a temperature that is lower than a conventional crystallizing temperature of tantalum oxide dielectric material until crystallization of the tantalum oxide capacitor dielectric occurs; and forming an upper electrode on the capacitor dielectric layer, wherein the lower electrode is formed of metal.

11. The method of claim 10, wherein the lower electrode is formed of a material selected from the group consisting of ruthenium and platinum.

12. The method of claim 11, wherein a metal organic material is used as a source of the CVD method.

13. The method of claim 12, wherein the pre-annealing does not substantially change the materiality of the lower electrode.

14. The method of claim 12, wherein the plasma atmosphere comprises a hydrogen gas.

15. A method of fabricating a semiconductor device, comprising the steps of:

forming a lower electrode on a substrate by CVD method using a source having carbon;

subjecting the lower electrode to a pre-annealing for removing carbon remaining in the lower electrode, wherein the pre-annealing is a treatment exposing the lower electrode under a plasma atmosphere;

depositing a tantalum oxide ($Ta_2O_5$) capacitor dielectric layer on the pre-annealed lower electrode;

subjecting the tantalum oxide ($Ta_2O_5$) capacitor dielectric layer to a temperature that is lower than a conventional crystallizing temperature of tantalum oxide dielectric material until crystallization of the tantalum oxide capacitor dielectric occurs;

forming an upper electrode on the capacitor dielectric layer, wherein the lower electrode is formed of metal, the pre-annealing is performed at a range of between 350~750° C., and the materiality and surface morphology of the lower electrode does not substantially change by the pre-annealing.

16. The method of claim 15, wherein the temperature at which the tantalum oxide layer is subjected to is about 650° C.

17. The method of claim 15, wherein the selected atmosphere comprises a hydrogen gas and the thermal annealing is performed at about 450° C.

18. The method of claim 15, wherein the selected atmosphere comprises a nitrogen gas and the thermal annealing is performed at about 700° C.

19. The method of claim 15, wherein the selected atmosphere is a mixed atmosphere including about 90% of nitrogen and about 10% of hydrogen by volume.

20. The method of claim 19, wherein the thermal annealing is performed at about 450° C.

21. The method of claim 5, wherein the pre-annealing is performed at about 450° C.

22. The method of claim 13, wherein the pre-annealing is performed at a range of between 350~750° C.

23. The method of claim 22, wherein the pre-annealing is performed at about 450° C.

* * * * *

UNITED STATES PATENT AND TRADEMARK OFFICE
CERTIFICATE OF CORRECTION

PATENT NO. : 6,982,205 B2
APPLICATION NO. : 10/055270
DATED : January 3, 2006
INVENTOR(S) : Joo et al.

It is certified that error appears in the above-identified patent and that said Letters Patent is hereby corrected as shown below:

On the Title page, Item 54 please replace "METHOD AND MANUFACTURING A SEMICONDUCTOR DEVICE HAVING A METAL-INSULATOR-METAL CAPACITOR" with -- METHOD FOR MANUFACTURING A SEMICONDUCTOR DEVICE HAVING A METAL-INSULATOR-METAL CAPACITOR--
Column 1, lines 1-4 please replace "METHOD AND MANUFACTURING A SEMICONDUCTOR DEVICE HAVING A METAL-INSULATOR-METAL CAPACITOR" with -- METHOD FOR MANUFACTURING A SEMICONDUCTOR DEVICE HAVING A METAL-INSULATOR-METAL CAPACITOR--
Column 2, line 20 please replace "700° C." with --700° C--
Column 2, line 24 please replace "400° C." with --400° C--
Column 5, line 14 please replace "($C_5H_5$(" with --($C_5H_5$)(--
Column 5, line 25 please replace "C.," with --C,--
Column 5, line 32 please replace "C." with --C--
Column 5, line 50 please replace "C.," with --C,--
Column 5, line 53 please replace "C.," with --C,---
Column 5, line 66 please replace "C." with --C--
Column 7, line 20 please replace "C.," with --C,--
Column 7, line 43 please replace "C.," with --C,--
Column 9, line 37 please replace "of tantalum" with --of a tantalum--
Column 9, line 39 please replace "dielectric occurs" with --delectric layer occurs--
Column 10, line 4 please replace "electrode subjecting" with --electrode; subjecting--
Column 10, line 7 please replace "of tantalum" with --of a tantalum--
Column 10, line 9 please replace "dielectric" with --dielectric layer--
Column 10, line 30 please replace "under a plasma" with --under plasma--
Column 10, line 31 please replace "oxide ($Ta_2O_5$) capacitor dielectric layer" with --oxide layer--

UNITED STATES PATENT AND TRADEMARK OFFICE

CERTIFICATE OF CORRECTION

PATENT NO. : 6,982,205 B2
APPLICATION NO. : 10/055270
DATED : January 3, 2006
INVENTOR(S) : Joo et al.

It is certified that error appears in the above-identified patent and that said Letters Patent is hereby corrected as shown below:

Column 10, line 35 please replace “of tantalum” with --of a tantalum--
Column 10, line 37 please replace “occurs;” with --occurs; and--
Column 10, line 42 please replace “C.,” with --C,--

Signed and Sealed this

Ninth Day of January, 2007

JON W. DUDAS
*Director of the United States Patent and Trademark Office*